United States Patent [19]

Walls et al.

[11] Patent Number: 4,533,620

[45] Date of Patent: Aug. 6, 1985

[54] LIGHT SENSITIVE CO-CONDENSATES

[75] Inventors: John E. Walls, Hampton; Thomas A. Dunder, High Bridge, both of N.J.

[73] Assignee: American Hoechst Corporation, Somerville, N.J.

[21] Appl. No.: 519,443

[22] Filed: Aug. 2, 1983

Related U.S. Application Data

[63] Continuation-in-part of Ser. No. 359,350, Mar. 18, 1982, abandoned.

[51] Int. Cl.³ .......................... G03C 1/54; G03F 7/08; C07C 113/04
[52] U.S. Cl. .................................. 430/157; 430/143; 430/175; 430/293; 430/300; 430/302; 430/325; 534/558; 534/561; 534/564
[58] Field of Search ................... 430/175, 157; 260/141 R, 141 P; 534/558, 561, 564

[56] References Cited

U.S. PATENT DOCUMENTS

| | | | |
|---|---|---|---|
| 3,406,159 | 10/1968 | Steppan et al. | 260/141 F |
| 3,849,392 | 11/1974 | Steppan | 430/302 |
| 3,867,147 | 2/1975 | Teuscher | 430/176 |
| 4,132,553 | 1/1979 | Burkle et al. | 430/175 |
| 4,288,520 | 9/1981 | Sprintschnik | 430/175 |
| 4,299,907 | 11/1981 | Burkle et al. | 430/175 |
| 4,414,311 | 11/1983 | Walls et al. | 430/169 |

Primary Examiner—Charles L. Bowers, Jr.
Attorney, Agent, or Firm—Richard S. Roberts

[57] ABSTRACT

Light sensitive condensed copolymers or multi-polymers of at least two distinct diazonium salts of the types specified herein. The product is characterized by high light speed, good shelf life and very good resistance to thermal and electrical degradation.

27 Claims, No Drawings

LIGHT SENSITIVE CO-CONDENSATES

CROSS REFERENCE TO RELATED APPLICATION

This application is a continuation in part of co-pending U.S. patent application Ser. No. 359,350 filed Mar. 18, 1982 now abandoned.

BACKGROUND OF THE INVENTION

The present invention relates to photosensitive compositions or more particularly to a class of unique diazonium compounds suitable for use in the lithographic arts for the production of printing plates and other photographic elements such as photoresists and color proofing films.

It is known that diazonium compounds characteristically vary widely in their light sensitivity, or speed, and their aging ability or shelf life. It is generally acknowledged that light speed and shelf life bear a reciprocal relationship to one another. That is, as light sensitivity increases, shelf life decreases and vice versa. Those skilled in the art are constantly seeking new ways of simultaneously increasing both properties. As a rule of thumb, commercial requirements demand that a lithographic printing plate have a shelf life of at least twelve months and preferably at least eighteen months prior to significant light speed degradation.

One method of achieving improved shelf life is to render a compound, considered to possess high light sensitivity, solvent soluble, from an otherwise water-soluble form. This approach will reduce the compound's hygroscopic nature which can and will adversely affect aging. However, this process will not improve the compound's light speed.

Using a technique described in U.S. patent application Ser. No. 359,458, filed on Mar. 18, 1982, now U.S. Pat. No. 4,414,311 and which is incorporated herein by reference, certain benefits are realized when the diazo to be applied to a metallic plate surface is coated via a cathodic electrodeposition from an electrolyte. Using such a technique results in a coating having marked improvement of adhesion and overall lithographic performance. It is observed that some diazonium compounds have enhanced stability properties when an electrical potential is applied as opposed to standard coating application methods. Generally, those diazos having the greatest stability when exposed to such an electrical force that would be used to create a cathodically deposited surface tend to have rather low UV sensitivity. In order to provide a compound capable of withstanding electrical potential, while still retaining high light speed, new approaches are taken to synthesize novel diazo-based polymers.

SUMMARY OF THE INVENTION

The present invention provides a class of diazo compounds demonstrating relatively high light speed and substantial resistance to thermal and electrical degradation.

The invention provides a composition of matter comprising a photosensitive polycondensation co- or multipolymer having one or more recurring units of the structure:

randomly or uniformly distributed along the copolymer chain, wherein A is

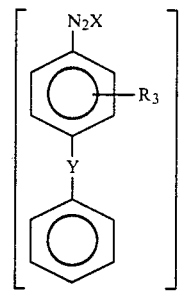

and B is

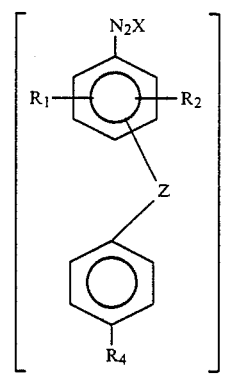

n ranges from 1 to 8;
m ranges from 1 to 8;
$R_1$ and $R_2$ are identical or different $C_1$–$C_2$ alkyl groups, $C_1$–$C_4$ alkoxy groups, halogen atoms or dimethylamino groups;
$R_3$ is selected from the group consisting of —H, —$CH_3$, —Cl, —$OCH_3$ or —$OCH_2CH_3$;
$R_4$ is selected from the group consisting of —H, —$CH_3$ or —Cl;
$R_5$ is a divalent linking group selected from the group consisting of —$CH_2$— or >$CHCH_3$;
X is an anion of the diazonium salt;
Y is selected from the group consisting of >NH,

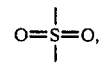

or —O—;
Z is selected from the group consisting of —S—; —O— or

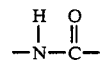

said photosensitive polycondensation product further characterized that the repeating B units are linked by an $R_5$ group when m is 2 or greater and the repeating A units are linked by an $R_6$ group when n is 2 or greater;
wherein $R_6$ is a divalent linking group selected from the group consisting of —$CH_2$—, >$CHCH_3$; or

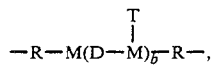

and

R is selected from the group consisting of —CH$_2$— and >C(CH$_3$)$_2$;

wherein: b is zero or an integer from 1 to about 9;

D is a divalent linking group selected from the group consisting of —CH$_2$— or —CH$_2$—O—CH$_2$—, T is selected from the group consisting of

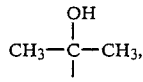

—CH$_2$OH, —CH$_2$O(CH$_2$)$_f$CH$_3$,

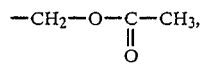

—CH$_2$Cl, —CH$_2$Br —H, or an R linking group, and is further characterized as being H— when D is —CH$_2$—O—CH$_2$—;

f is zero or an integer from 1 to 3; and

M is an aromatic radical selected from the group consisting of aromatic hydrocarbons, diaryl ethers, diaryl sulfides, diaryl disulfides, diaryl sulfones, diaryl amines, diaryl ketones and diaryl diketones; and n and m are present at a ratio of 1:8–8:1, The starting monomers need not be positioned in any particular order on the resultant copolymer.

The invention also comprises a light sensitive composition containing the above identified diazo compound in admixture with such additional optional ingredients as binder resins, colorants, solvents, plasticizers, surfactants and acids as well as a photographic element comprising such a light sensitive composition disposed on a suitable substrate.

In the preferred case, the structure given above recurrs from 1 to 10 times in said co- or multi-polymer. When such recurring happens, the co- or multi-polymer of claim 1 wherein recurring

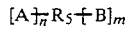

units above one are linked by R$_6$ when an [A]$_n$ group is linked to another [A] group, and by R$_5$ when a [B]$_m$ group is linked to another [B]$_m$ group or to an [A]$_n$ group.

DETAILED DESCRIPTION OF THE PREFERRED EMBODIMENT

The compounds of the present invention may be generally described as the products of the condensation reaction(s) wherein two or more diazotized diaryl structures are reacted with either paraformaldehyde or suitable monomers or oligomers that are capable of reacting with and becoming part of the aryl structure of the diazo monomer which does not have as part of it the diazo group. The media used are advantageously acids, particularly inorganic acids and more particularly sulfuric or phosphoric acids. Suitable diazo monomers may be 4-diazo diphenyl amine sulfate, 3-alkoxy-4-diazo diphenyl amine sulfate (where alkoxy is C=1–4), 2,5-dialkoxy-4-diazo diphenyl sulfide sulfate (where alkoxy groups are C=1–4), 2,5-dialkoxy-4-(p-tolyl mercapto)-benzene zinc chloride salt (where the alkoxy groups are C=1–4), 2,5-dialkoxy-4-benzoylamine diazo benzene zinc chloride salt (where alkoxy groups are C=1–4 or 5-chloro-4-diazo-2-(4-chlorophenyl ether)-N,N-dimethyl aniline zinc chloride salt.

The condensing monomers are advantageously 4,4'-bis-P methyl diphenyl-W compounds where W may equal —CH$_2$—, —O—, —S—, —S—S—, >NH,

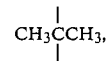

aromatic hydrocarbons, diaryl ethers, diaryl sulfides, diaryl sulfones, diaryl amines, aromatic disulfides, diaryl ketones, diaryl deketones, or is absent and where the P is —Cl, —Br, —OH, —OCH$_3$, —OCH$_2$CH$_3$, —O(CH$_2$)$_2$CH$_3$, or —O(CH$_2$)$_3$CH$_3$. Oligomers used for condensation with the diazo monomers may be the homocondensates of any of the previously described condensing monomers, except paraformaldehyde, or may be the co-condensates of any of the foregoing. With paraformaldehyde condensation reactions with the diazo, the preferred medium is sulfuric acid. With condensing monomers, or pre-diazo, co-condensation reactions either with or without paraformaldehyde, the reactions are best carried out in phosphoric acid. When using sulfuric acid for the diazo reaction, the preferred concentration is 96% although dilutions to the point of non-protonation, i.e. non-reactivity, are useful. Temperatures with sulfuric acid may vary from freezing to room temperature although a more preferred range is from about −6° C. to about 15° C. with the most preferred range being from about 6° C. to about 12° C. With phosphoric acid condensation reactions, an 85% concentration is generally adequate for ring protonation, although dilution to the point of non-reactivity is also useful. There are certain instances where increased activity is wanted to achieve the desired results, in which case P$_2$O$_5$ may be advantageously added to elevate the activity of the medium when phosphoric acid is the medium. With phosphoric acid, temperatures of from about 10° C. to about 60° C. are useful whereas temperatures between 20° C. and 50° C. are more preferred and temperatures between 35° C. and 45° C. are most preferred.

Although not a prerequisite for achieving the product of the invention, it is advantageous when at least one of the diazo monomers used is a diaryl sulfide type preferably having a dialkoxy substitution on the ring to which the diazo group is attached.

The final product, when isolated from the acid medium in which it was reacted, is isolated as the water-soluble salt of the acid used in the final stage of reaction, if a multi-stage reaction is employed.

A typical reaction would have the diazo monomer(s) added to the condensing acid after which the condensing monomer is slowly added so as to allow for close temperature control. Those versed in the art will recognize that rapid addition of diazo to monomer or monomer to diazo will result in an exothermic reaction that may render the final product unusable as a result of decomposition stemming from the loss of temperature control. If this is to be the final step, the product is isolated from the acid using known techniques, such as alcohol precipitation, and is then sufficiently treated with activated charcoal after which it is finally isolated as the pure product. If the product is to be post reacted with another diazo and monomer, it is isolated as a concentrate after which it is dissolved in the acid to be used for the subsequent condensing reaction and thusly treated. Reaction time may range from about 5 to about 300 minutes, more preferably from about 30 to about 250 minutes and most preferably from about 90 to about 180 minutes. The product is isolated and likewise washed with activated charcoal and prepared as the pure product. When a condensing monomer or oligomer is added to an acid containing a diazo compound with which it is intended to react, an aging period under isothermic conditions is desired to insure homogeneity and full utilization of reactants. A range of aging times may vary from about ½ to 48 hours. A more preferred range is from about 10 to about 30 hours with the most preferred range being from about 12 to about 20 hours.

Suitable anions for the finished diazo product, when water solubility is desired, may be isolated as the anion of the acid used for condensation, i.e., $HSO_4^-$, $H_2PO_4^-$, $Cl^-$ or $Br^-$. Anions such as methane sulfonate, sulfosalicylate and p-toluene sulfonate may be used when water and solvent solubility is desired. Anions such as mesitylene sulfonate and other aryl sulfonates, $BF_4^-$, and $PF_6^-$ may be used when solvent solubility is desired.

Lithographically suitable photosensitive compositions used in the manufacture of photosensitive elements such as printing plates, photoresists or proofing films, typically comprise aromatic diazonium salts, binder resins, dyes or pigments, indicators and stabilizing additives, which are applied to a suitable substrate, usually comprising aluminum.

The diazo compounds of the present invention, as is the case with all known compounds, may be used in an aqueous or solvent system depending upon the anion used for precipitation in amounts ranging from about 5% to about 65% by weight of the solid components in the composition. A more preferred range is from about 15% to about 50% and the most preferred range is from about 25% to about 45%.

Binder resins are typically admixed with the diazo to extend the number of copies a plate may reproduce. Examples of such binding resins include polyurethanes, polyvinylformals, polyols, polyacrylates, polyvinyl acetates and phenol-formaldehyde resins among a wide variety of others as are well known in the art. Such resins are generally used in amounts ranging from about 5% to 75% by weight of the solid components in the composition. A more preferred range is from about 15% to about 60% with the most preferred range being from about 25% to about 55%.

As a colorant, pigments or dyes are commonly employed with pigments being somewhat better. Types of pigments include phthalocyanines and anthroquinones and their substituted analogs. The amount of colorant may vary from about 2% to about 35% by weight of the solid components in the composition, with a more preferred range being from about 7% to 25% and the most preferred range being from about 10% to about 20%.

Stabilizing compounds are typically introduced to impart improved aging characteristics when the coating is used to make a presensitized photographic element. Examples of such compounds are citric, p-toluene sulfonic, tartaric and phosphoric acids. Depending upon the results sought, the amount used may vary from about 0.5% to about 15% by weight of the solid components of the composition. A more preferred range is from about 1.0% to about 10% while the most preferred range is from about 2.5% to about 5.0%.

The solvents used in which the aforementioned ingredients are dissolved are varied and numerous and may include water. A solvent or solvents selected are chosen with the type of coating desired and type of coating device to be used in mind. The selection of the solvent system is easily made by one skilled in the art.

The above details what is expected using conventional coating techniques. None of this applies in the case of the coating application made using cathodic deposition. The use of electricity precludes the use of the many ingredients other than the diazo compounds. Due to the varing conductivity of such ingredients, a uniform film is not easily obtained. In this case, the use of the diazo compounds of the present invention is done when the compound is the only additive in a preferably aqueous solution. Certain solvents such as dimethyl formamide and formamide may be used alone or more advantageously admixed with deionized water. When using an EMF as the means of coating, diazo compounds are typically used in amounts varying from about 0.1% to about the saturation point of the specific compound. A more preferred range is from about 0.5% to about 5% while the most preferred range is from about 1% to about 3% by weight.

The following non-limiting examples illustrate the invention:

EXAMPLE 1

18.0 grams of 4-diazo diphenyl amine sulfate are dissolved in 80 grams of concentrated sulfuric acid and adjusted to a temperature of 6° C. To the solution is slowly added 1.9 grams of paraformaldehyde over a two hour period while maintaining an isothermal condition. Upon completing the addition of the paraformaldehyde, the reaction mixture is aged for 16 hours after which the product of the reaction is isolated as the sulfate salt with a yield of 18.7 grams.

EXAMPLE 2

Example 1 is duplicated except that phosphoric acid is substituted for sulfuric acid and a temperature of 42° C. is employed in lieu of 6° C. All times and weights are unchanged. The reaction product is isolated as the phosphate salt with a yield of 18.9 grams. In both cases, care is exercised to tightly control the temperature.

EXAMPLE 3

20.0 grams of 3-methoxy-4-diazo diphenyl amine sulfate is dissolved in 90.0 grams of phosphoric acid after which the temperature is adjusted to and held at 40° C. Slowly added in a dropwise fashion is 14.7 grams of 4,4'-Bis-methoxy methyl diphenyl ether over a 2½ hour period. The reaction mixture is then aged for 17 hours. Upon completion of the specified aging time, the product is isolated, using well known techniques as the phosphate salt. A yield of 32.9 grams is obtained.

EXAMPLE 4

25.1 grams of 4,4'-Bis-methoxy methyl diphenyl ether is homocondensed in an equal amount of phosphoric acid. The condensation reaction is allowed to proceed for 30 minutes during which time the temperature is held constant at 20° C. This homocondensate mixture is slowly added over a 1½ hour period to a solution already having been prepared by dissolving 20.0 grams of 3-methoxy-4-diazo diphenyl amine sulfate in 90.0 grams of phosphoric acid. This solution is initially 40° C. and is subsequently maintained at the same temperature. The product of the reaction is isolated as the phosphate salt after 17 hours of aging. A yield of 43.4 grams is obtained.

EXAMPLE 5

12 grams of 4-diazo diphenyl amine sulfate and 68.5 grams of 2,5-dimethoxy-4-diazo(-4-tolyl mercapto)benzene zinc chloride are added to 300 grams of concentrated sulfuric acid. When fully dissolved while being held at 6° C. and with constant agitation, 3.7 grams of paraformaldehyde is slowly added over a two hour period. During the addition time, care should be taken to insure an isothermal state. After the addition of acid, the reaction slurry is allowed to age for 16 hours. After the aging period is completed, the product is isolated from the acid as a sulfate salt using known separating techniques. A yield of 78.6 grams is obtained.

EXAMPLE 6

15.0 grams of 4-diazo diphenyl amine sulfate is dissolved in 60.0 grams of concentrated phosphoric acid. The temperature is then adjusted to 42° C. To this mixture is slowly added over a 3 hour period, 13.3 grams of 4,4'-bis-methoxy methyl diphenyl ether. Care should be exercised so as to maintain an isothermal state. When the addition is complete, the reaction slurry is allowed to age for 17 hours after which the product is isolated as the phosphate salt. The resulting compound has a yield of 26.3 grams and is subsequently dissolved in 110.0 grams of concentrated sulfuric acid. When fully dissolved and after the temperature is adjusted to 10° C., 28.5 grams of 2,5-dibutoxy-4-diazo(-4-tolyl mercapto)-benzene zinc chloride salt are added and likewise dissolved. 1.5 grams of paraformaldehyde is slowly added over a 2 hour period while exercising great care in maintaining the temperature at 10° C. After all of the paraformaldehyde is added, the slurry is aged for 16 hours. The product is then isolated as the sulfate salt with a yield of 54.7 grams.

EXAMPLE 7

16 grams of 2-(4-chlorophenyl ether)-4-diazo-5-chloro dimethyl aniline zinc chloride is added to concentrated sulfuric acid. The solution is adjusted to 10° C. after which 9.9 grams of 4-diazo diphenyl amine is added. When fully dissolved, 1.0 grams of paraformaldehyde is slowly added over a 2 hour period while maintaining a constant temperature. The slurry is then aged for 18 hours after which the product is isolated as the sulfate salt having a yield of 25.5 grams.

EXAMPLE 8

15 grams of the product described in Example 3 is dissolved in 60 grams of concentrated sulfuric acid. To this mixture is added 7.5 grams of 2,5-dibutoxy-4-diazo(-4-tolyl mercapto)benzene zinc chloride. The slurry is adjusted to 10° C. after which 0.5 grams of paraformaldehyde is slowly added over a 2 hour period. The slurry is then aged for 17 hours. The product is isolated as the sulfate salt and has a yield of 21.7 grams.

EXAMPLES 9 TO 24

The following examples tabulate the results obtained when using the products of Examples 1 through 8. When tested in the immersion process, a 1.0% (W/W) solution is used at room temperature. Treatment time is 60 seconds.

For testing using a cathodic deposition process, a 1.0% (W/W) solution of the diazonium compound to be tested is placed in a beaker between two lead electrodes at a distance of 5.0 cm from either side. The aluminum is made the cathode of a DC circuit. Both lead electrodes are made anodic. A potential of 30 VDC is used.

The aluminum surface used is prepared by electrolytically treating an etched and cleaned surface of 3003 alloy aluminum with 10 g/l polyvinyl phosphonic acid. The aluminum is made the anode and an EMF of 30 VDC is used to produce a film having a weight of approximately 350 mg/M$^2$.

In both the immersion and cathodic deposition processes, plates after treatment are well rinsed and blotted dry.

| Example | Diazo From Ex. | Process | Exposure in mJ/cm$^2$* | Aging+ | Length of Run | Any Noticed Degradation |
|---|---|---|---|---|---|---|
| 9 | 1 | Immersion | 218 | 240 | — | Slightly weak image |
| 10 | 1 | Cathodic Deposition | 113 | 295 | — | Precipitate at anode |
| 11 | 2 | Immersion | 239 | 265 | 6,000 | Satisfactory |
| 12 | 2 | Cathodic Deposition | 120 | 310 | 70,000 | Precipitate at anode |
| 13 | 3 | Immersion | 102 | 170 | — | Satisfactory |
| 14 | 3 | Cathodic Deposition | 20 | 205 | — | Degraded in solution |
| 15 | 4 | Immersion | 14 | 50 | — | Weak image |
| 16 | 4 | Cathodic Deposition | 9 | 90 | — | Degraded in solution |
| 17 | 5 | Immersion | 136 | 265 | 15,000 | Satisfactory |
| 18 | 5 | Cathodic Deposition | 24 | 305 | 105,000 | Satisfactory |
| 19 | 6 | Immersion | 51 | 270 | — | Satisfactory |
| 20 | 6 | Cathodic Deposition | 10 | 295 | — | Satisfactory |
| 21 | 7 | Immersion | 154 | 215 | — | Satisfactory |
| 22 | 7 | Cathodic Deposition | 47 | 235 | — | Satisfactory |
| 23 | 8 | Immersion | 46 | 255 | 14,000 | Satisfactory |
| 24 | 8 | Cathodic | 12 | 280 | 115,000 | Satisfactory |

| | | Examples 9 to 24 | | | |
|---|---|---|---|---|---|
| Example | Diazo From Ex. | Process | Exposure in mJ/cm$^2$* | Aging+ | Length of Run | Any Noticed Degradation |
| | | Deposition | | | |

*Energy used for exposure to result in a solid 6 using a 21 Stauffer Step Wedge after subtractive development and inking.
+Time in minutes at 100° C. baking a presensitized plate would be acceptable before the background would begin to scum. At least 120 minutes, which translates to approximately a one year shelf life, is required for satisfactory performance.

EXAMPLE 25

Example 1 is repeated as described up to and including the aging of the reaction mixture. At this point the reaction mixture is added to 600 ml of water and precipitated as the sulfonate salt of p-toluene sulfonic acid. The precipitate is isolated and dried. A yield of 17.3 g is obtained.

One may attempt to produce a 1.0% (w/w) solution of the diazo with ethylene glycol monomethyl ether but it is found that the diazo is not adequately soluble. A 1.0% solution is then made using deionized water where the solubility is found to be good. A sheet of aluminum grained with a quartz slurry, anodized and hydrophilized using known techniques is whirl coated with the aqueous diazo solution. The dried plate is subsequently exposed to a mercury vapor light source with an integrated energy of 300 millijoules/cm$^2$. The plate is developed with tap water only and run on a sheet-fed offset press. The printed copy yields a solid 5 on a 21 step Stouffer Step Wedge and the plate produces 12,000 acceptable copies.

EXAMPLE 26

Example 1 is again repeated except that the 4-diazo diphenyl amine sulfate is replaced with 2,5-diethoxy-4-diazo tolylmercapto benzene zinc chloride salt. The product, condensed with paraformaldehyde in sulfuric acid at 6° C. and aged for 16 hours, is added to 600 ml of deionized water and precipitated as the sulfonate salt of p-toluene sulfonic acid. The precipitate is isolated and dried. A yield of 17.6 g is obtained.

One may attempt to produce a 1.0% (w/w) solution of the diazo with deionized water but it is found that the diazo is not adequately soluble. A 1.0% solution is then made using ethylene glycol monomethyl ether where the solubility is found to be good. A sheet of aluminum grained with a quartz slurry, anodized and hydrophilized using known techniques is whirl coated with the solvent diazo solution. The dried plate is subsequently exposed to a mercury vapor light source with an integrated energy of 300 millijoules/cm$^2$. The plate is developed with tap water only and run on a sheet-fed offset press. The printed copy appears to yield a solid 7 on a 21 step Stouffer Step Wedge however the background is severely scummed. Due to the scumming of the non-image area, no determination can be made concerning length of run.

EXAMPLE 27

Example 5 is repeated as described up to and including the aging of the reaction mixture. At this point the reaction mixture is dissolved in 3 liters of deionized water and precipitated as the sulfonate salt of p-toluene sulfonic acid.

A 1.0% (w/w) solution can be prepared with both dionized water and ethylene glycol monomethyl ether. A sheet of aluminum grained with a quartz slurry, anodized and hydrophilized using known techniques is whirl coated with the solvent diazo solution. The dried plate is subsequently exposed to a mercury vapor light source with an integrated energy of 300 millijoules/cm$^2$. The plate is developed with tap water only and run on a sheet-fed offset press. The printed copy yields a solid 9 on a 21 step Stouffer Step Wedge and the plate produces over 50,000 acceptable copies.

From the above examples, the utility and advantages of the present invention can be seen. Examples 8 through 16 use diazo compounds representative of the prior art. Examples 17 through 24 use the diazo compounds of the present invention. Independent of the diazo the following general statements may be made. Plates prepared using the cathodic deposition process run longer, age better and require less energy for proper exposure than do the respective counterparts made using the immersion process.

One advantage of the co-condensates of the present invention over prior art compounds is their greater stability when using an electrical potential. Examples 10, 12, 14, and 16 had either a degradation or a precipitation, both of which is undesirable whereas Examples 18, 20, 22, and 24 displayed no similar phenomena.

When comparing Examples 24 and 18 to Example 12, as well as Examples 23 and 17 to Example 11, where two novel diazo compounds are compared to a known diazo using the cathodic deposition and immersion processes, respectively, it can be seen that there is a distinct improvement in press performance.

In further contrasting the novel diazo compounds to those of the prior art, it is seen in Examples 9 through 16 that as the energy required to produce an adequate exposure decreases, there is a corresponding decrease in aging ability. Examples 17 through 24 demonstrate a high speed system without the proportional loss of aging ability.

Example 25 uses an [A] type diazo monomer only and results in a short press performance. Example 26 uses a [B] type diazo and is not water developable. Example 27 uses a condensed [A]-[B] diazo type which gives water developability and good length of run.

What is claimed is:

1. A photosensitive polycondensation co- or multipolymer having one or more recurring units of the structure:

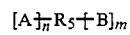

randomly or uniformly distributed along the copolymer chain, wherein
A is

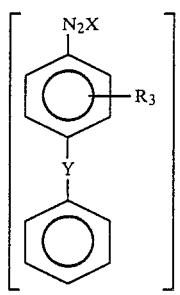

and
B is

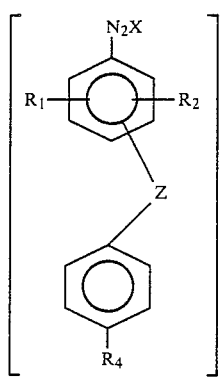

n ranges from 1 to 8;
m ranges from 1 to 8;
$R_1$ and $R_2$ are identical or different $C_1$-$C_2$ alkyl groups, $C_1$-$C_4$ alkoxy groups, halogen atoms or dimethylamino groups;
$R_3$ is selected from the group consisting of —H, —$CH_3$, —Cl, —$OCH_3$ or —$OCH_2CH_3$;
$R_4$ is selected from the group consisting of —H, —$CH_3$ or —Cl;
$R_5$ is a divalent linking group selected from the group consisting of —$CH_2$— or >$CHCH_3$;
X is an anion of the diazonium salt;
Y is selected from the group consisting of >NH, or

Z is selected from the group consisting of —S—; —O— or

said photosensitive polycondensation product further characterized that the repeating B units are linked by an $R_5$ group when m is 2 or greater and the repeating A units are linked by an $R_6$ group when n is 2 or greater;
wherein $R_6$ is a divalent linking group selected from the group consisting of —$CH_2$—, >$CHCH_3$; or

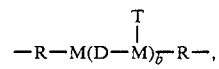

and
R is selected from the group consisting of —$CH_2$— and >$C(CH_3)_2$;
wherein:
b is zero or an integer from 1 to about 9;
D is a divalent linking group selected from the group consisting of —$CH_2$— or —$CH_2$—O—$CH_2$—,
T is selected from the group consisting of

—$CH_2Cl$, —$CH_2Br$—H, or an R linking group, and is further characterized as being H— when D is —$CH_2$—O—$CH_2$—;
f is zero or an integer from 1 to 3; and
M is an aromatic radical selected from the group consisting of aromatic hydrocarbons, diaryl ethers, diaryl sulfides, diaryl disulfides, diaryl sulfones, diaryl amines, diaryl ketones and diaryl diketones; and
n and m are present at a ratio of 1:8–8:1.

2. The co- or multi-polymer of claim 1 wherein recurring

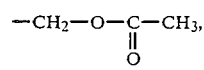

units above one, are linked by $R_6$ when an [A]$_n$ group is linked to another [A]$_n$ group, and by $R_5$ when a [B]$_m$ group is linked to another [A]$_n$ group or to an [B]$_m$ group.

3. The co- or multi-polymer of claim 1 wherein said structure recurrs from 1 to about 10 times in said copolymer.

4. The composition of claim 1 wherein
$R_1$= —$OCH_3$, —$OCH_2CH_3$, —$O(CH_2)_3CH_3$
$R_3$= —H
$R_4$= —H, —$CH_3$
$R_5$= —$CH_2$—,

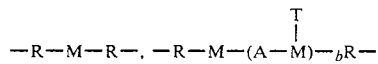

X=$H_2PO_4$—, $HSO_4$—
Y= >NH
Z= —S—
n:m=2:1–1:2
n+m=12–15.

5. The composition of claim 1 wherein
$R_1$= —$O(CH_2)_3CH_3$
$R_3$= —H
$R_4$= —$CH_3$
$R_5$= —$CH_2$—

X=H₂PO₄—
Y= >NH
Z=—S—
n+m=12-15
n:m=1:1-1:2.

6. The composition of claim 1 wherein
R₁=—OCH₃
R₃=—H
R₄=—CH₃
R₅=—CH₂—
X=

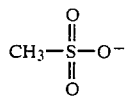

Y= >NH
Z=—S—
n+m=18
n:m=1:5.

7. The composition of claim 1 wherein
R₁=—OCH₂CH₃
R₃=—OCH₃
R₄=—CH₃
R₅=—CH₂—
X=

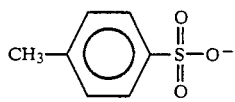

Y= >NH
Z=—S—
n+m=32
n:m=1:7.

8. The composition of claim 1 wherein
R₁=—O(CH₂)₃CH₃
R₃=—OCH₃
R₄=—CH₃
R₅=—R—M—R—

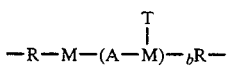

X=H₂PO₄—
Y= >NH
Z=—S—
n+m=12-15
n:m=1:1-1:2.

9. The composition of claim 1 wherein
R₁=—N(CH₃)₂
R₃=—H
R₄=—Cl
R₅=—CH₂—
X=HSO₄⁻
Y= >NH
Z=—S—
n+m=12-15
n:m=1:1-1:2.

10. A photographic element comprising a substrate and a coating disposed on said substrate, said coating comprising the composition of claim 1.

11. A photographic element comprising a substrate and a coating disposed on said substrate, said coating comprising the composition of claim 2.

12. A photographic element comprising a substrate and a coating disposed on said substrate, said coating comprising the composition of claim 3.

13. A photographic element comprising a substrate and a coating disposed on said substrate, said coating comprising the composition of claim 4.

14. A photographic element comprising a substrate and a coating disposed on said substrate, said coating comprising the composition of claim 5.

15. A photographic element comprising a substrate and a coating disposed on said substrate, said coating comprising the composition of claim 6.

16. A photographic element comprising a substrate and a coating disposed on said substrate, said coating comprising the composition of claim 7.

17. A photographic element comprising a substrate and a coating disposed on said substrate, said coating comprising the composition of claim 8.

18. A photographic element comprising a substrate and a coating disposed on said substrate, said coating comprising the composition of claim 9.

19. The photographic element of claim 10 wherein said substrate comprises aluminum and said composition further comprises one or more ingredients selected from the group consisting of binding resins, colorants, indicators and stabilizing additives.

20. The photographic element of claim 11 wherein said substrate comprises aluminum and said composition further comprises one or more ingredients selected from the group consisting of binding resins, colorants, indicators and stabilizing additives.

21. The photographic element of claim 12 wherein said substrate comprises aluminum and said composition further comprises one or more ingredients selected from the group consisting of binding resins, colorants, indicators and stabilizing additives.

22. The photographic element of claim 13 wherein said substrate comprises aluminum and said composition further comprises one or more ingredients selected from the group consisting of binding resins, colorants, indicators and stabilizing additives.

23. The photographic element of claim 14 wherein said substrate comprises aluminum and said composition further comprises one or more ingredients selected from the group consisting of binding resins, colorants, indicators and stabilizing additives.

24. The photographic element of claim 15 wherein said substrate comprises aluminum and said composition further comprises one or more ingredients selected from the group consisting of binding resins, colorants, indicators and stabilizing additives.

25. The photographic element of claim 16 wherein said substrate comprises aluminum and said composition further comprises one or more ingredients selected from the group consisting of binding resins, colorants, indicators and stabilizing additives.

26. The photographic element of claim 17 wherein said substrate comprises aluminum and said composition further comprises one or more ingredients selected from the group consisting of binding resins, colorants, indicators and stabilizing additives.

27. The photographic element of claim 18 wherein said substrate comprises aluminum and said composition further comprises one or more ingredients selected from the group consisting of binding resins, colorants, indicators and stabilizing additives.

* * * * *